(12) United States Patent
Bhaskaran

(10) Patent No.: US 7,039,394 B2
(45) Date of Patent: May 2, 2006

(54) COMMUNICATION SYSTEM AND METHOD FOR COMPRESSING INFORMATION SENT BY A COMMUNICATION DEVICE TO A TARGET PORTABLE COMMUNICATION DEVICE

(75) Inventor: Harikrishnan Bhaskaran, Dallas, TX (US)

(73) Assignee: Good Technology, Inc., Santa Clara, CA (US)

( * ) Notice: Subject to any disclaimer, the term of this patent is extended or adjusted under 35 U.S.C. 154(b) by 224 days.

(21) Appl. No.: 10/721,449

(22) Filed: Nov. 25, 2003

(65) Prior Publication Data

US 2005/0114120 A1  May 26, 2005

(51) Int. Cl.
*H04M 3/42* (2006.01)

(52) U.S. Cl. .............. 455/414.1; 455/412.1; 455/418; 341/51; 341/87

(58) Field of Classification Search ........... 455/418, 455/414.1; 707/100, 201, 202, 204; 713/150; 341/51, 87
See application file for complete search history.

(56) References Cited

U.S. PATENT DOCUMENTS

| | | | |
|---|---|---|---|
| 4,876,541 A * | 10/1989 | Storer | 341/51 |
| 5,280,600 A | 1/1994 | Van Maren et al. | |
| 5,353,024 A | 10/1994 | Graybill | |
| 5,442,350 A | 8/1995 | Iyer et al. | |
| 5,561,421 A | 10/1996 | Smith et al. | |
| 5,585,793 A | 12/1996 | Antoshenkov et al. | |
| 5,598,388 A | 1/1997 | Van Maren et al. | |
| 5,635,931 A | 6/1997 | Franaszek et al. | |
| 5,729,228 A | 3/1998 | Franaszek et al. | |
| 5,850,565 A | 12/1998 | Wightman | |
| 5,951,623 A | 9/1999 | Reynar et al. | |
| 5,953,503 A | 9/1999 | Mitzenmacher et al. | |
| 6,012,062 A | 1/2000 | Jagadish et al. | |
| 6,082,776 A | 7/2000 | Feinberg | |
| 6,098,040 A | 8/2000 | Petroni et al. | |
| 6,301,394 B1 | 10/2001 | Trout | |
| 6,330,574 B1 | 12/2001 | Murashita | |
| 6,360,011 B1 | 3/2002 | Katsumata et al. | |
| 6,415,295 B1 | 7/2002 | Feinberg | |
| 6,466,999 B1 | 10/2002 | Sliger et al. | |
| 6,522,268 B1 | 2/2003 | Belu | |
| 6,529,912 B1 | 3/2003 | Satoh et al. | |

* cited by examiner

*Primary Examiner*—Sonny Trinh
*Assistant Examiner*—Dung Lam
(74) *Attorney, Agent, or Firm*—Blakely Sokoloff Taylor & Zafman LLP

(57) ABSTRACT

A method and system are provided for compressing information to be sent from a server to a client such as a portable communication device. The server maintains first and second dictionaries for each portable device in the system. The first dictionary is provided to the portable communication device. The server generates more recent second dictionaries as new data comes into the server to be sent to a particular portable device. Communication between the server and a particular portable device is possible over a low cost wire line connection or a more expensive wireless connection. The more recent and accurate second dictionary, together with data compressed using the second dictionary, is sent to the portable device when the portable device is connected to the server by the less expensive wire line connection. However, when the portable device is connected to the server by the more expensive wireless connection, then the server compresses the data to be transmitted to the portable device using the first dictionary which is already stored on the portable device.

19 Claims, 2 Drawing Sheets

COMMUNICATION SYSTEM AND METHOD FOR COMPRESSING INFORMATION SENT BY A COMMUNICATION DEVICE TO A TARGET PORTABLE COMMUNICATION DEVICE

BACKGROUND

The disclosures herein relate generally to communication systems and more particularly to communication systems which compress text and other information for more efficient transmission to portable communication devices.

Intelligent mobile or portable devices such as personal digital assistances (PDA's), smart phones and small handheld computers are becoming more common. To enable mail and other messages to be electronically delivered to mobile devices, the mobile device is typically connected to a mail server either through a wireless link or by a fixed wired connection when the device is cradled or docked. The fixed wire connection, such as via a docking cradle of an internet-connected desktop computing station, tends to be a relatively inexpensive way to connect a mobile or portable communication device to a distant mail server. In contrast, a wireless link tends to be a much more expensive way to connect a portable communication device to a distant mail server. This is so because the infrastructure required for wireless communication is more costly and more bandwidth limited than typical wire line infrastructure. To make more efficient use of available bandwidth, compression techniques are often employed.

It is useful to occasionally update the portable device with information from the mail server. For example, as time goes by the mail server will receive mail which is addressed to a particular portable device. The activity of updating the portable device's stored data with messages and data intended for a particular portable device may be referred to as synchronizing or synching the mobile device. A typical conventional communication system may include hundreds of portable devices each with its own mailbox on the mail server. Periodically the mail server can open all of the mailboxes and send newly arrived messages to the mobile devices.

In a mail or other data exchange between a conventional mail server and a portable device, the compression methods used typically analyze the data that needs to be transmitted by one device to the other, i.e. from the mail server to the portable device. Existing methods analyze the data to find the most frequently repeated patterns of text that appear in the data and encode them using fewer bytes while transmitting the patterns also as part of the data. In other words, the mail server sends a dictionary of the repeated patterns to the receiving portable device so that the receiving portable device will know how to decode the pattern on the other end.

What is needed is a way to achieve greater effective compression rates when transmitting data between two or more devices and a way to more efficiently use available bandwidth.

SUMMARY

Accordingly, in one embodiment, a method is provided for communicating data stored on a first communication device to a second communication device. The method includes receiving data by the first communication device. The method also includes generating first and second dictionaries from the received data on the first communication device, the first dictionary being based on data received earlier than the data used to generate the second dictionary, the first dictionary being provided to the second communication device. The method also includes sending the second dictionary to the second communication device if the second communication device is presently connected to the first communication device by a first channel therebetween exhibiting a cost of operation less than the cost of operation of a second channel therebetween.

In another embodiment, a communication system is provided including a first communication device for receiving data. The system also includes a second communication device connectable to the first communication device by a first channel or a second channel therebetween, the first channel exhibiting a cost of operation less than the cost of operation of the second channel. The first communication device includes first and second dictionaries which are generated in the first communication device, the first dictionary being based on data received earlier than data used to generate the second dictionary. The first dictionary is provided to the second communication device. The first communication device sends the second dictionary to the second communication device if the second communication device is presently connected to the first communication device by a first channel therebetween exhibiting a cost of operation less than the cost of operation of the second channel therebetween.

A principal advantage of the embodiments disclosed is that channels used to send compressed data between first and second communication devices are more efficiently used.

DETAILED DESCRIPTION

Figure 1:
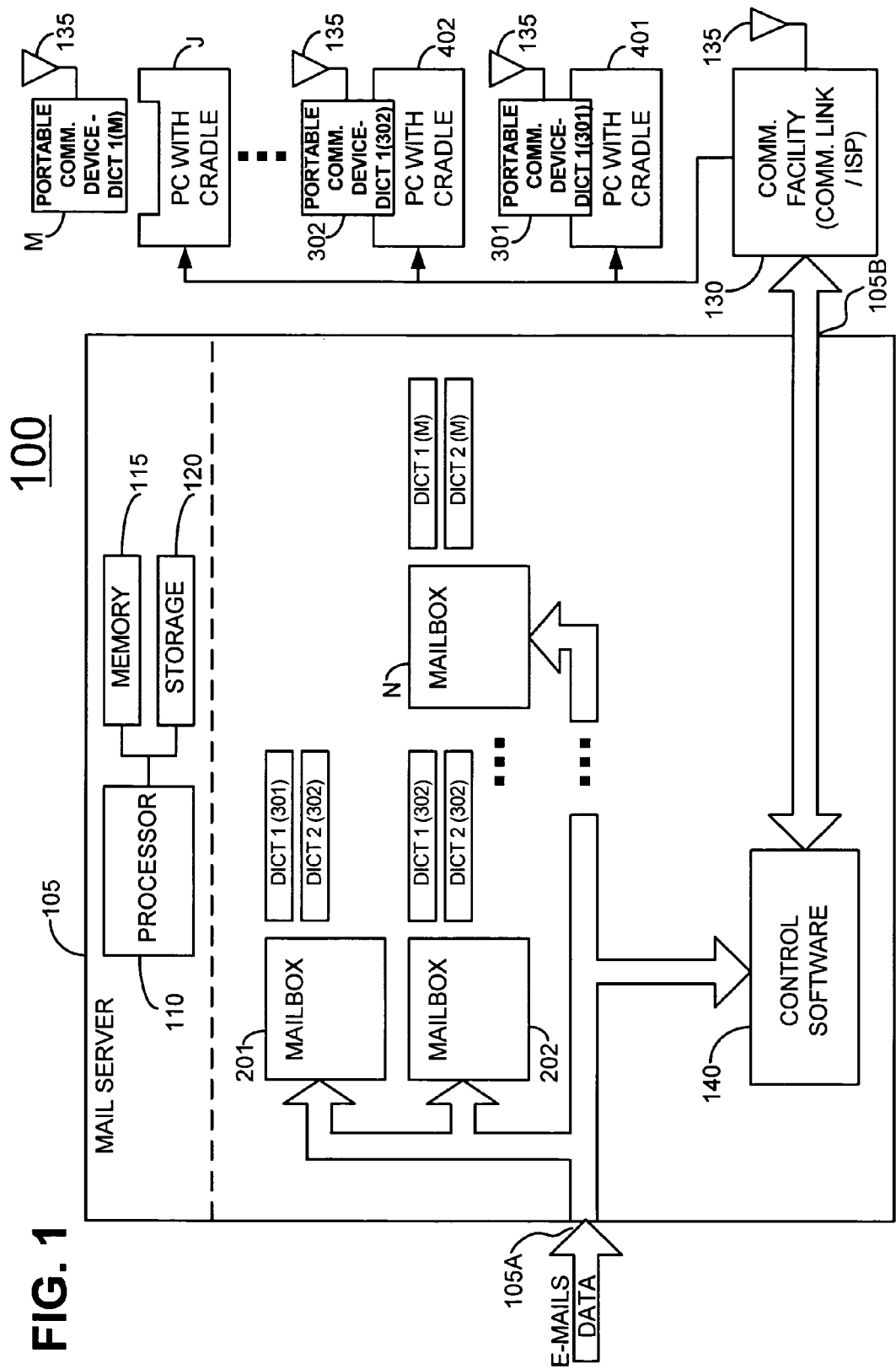
FIG. 1 is a block diagram of the disclosed communication system.

The present disclosure provides a unique method for compressing data transmitted from one communication device to another. It is understood, however, that the following disclosure suggests many different embodiments, or examples, for implementing different features of the invention. Specific examples of components, signals, messages, protocols, and arrangements are described below to simplify the present disclosure. These are, of course, merely examples and are not intended to limit the invention from that described in the claims. Well-known elements are presented without detailed description in order not to obscure the present invention in unnecessary detail. For the most part, details unnecessary to obtain a complete understanding of the present disclosure have been omitted in as much as such details are within the skills of persons of ordinary skill in the relevant art.

In conventional data compression techniques, the data to be transmitted from one device to another is analyzed to locate the most frequently repeated blocks or patterns of information. Once such repeated patterns are found, that data is encoded so that the patterns are represented by the least number of bits. Thus, the encoding creates a compressed form of the original data. The repeated patterns themselves are part of the data which is transmitted from one device to another as a dictionary during the same transmission session. The dictionary enables the receiving device to decompress the received compressed data.

The disclosed system and method involves the handling of data to be transmitted from one communication device, such as a mail server, to another communication device, such as a portable hand-held device. In the disclosed technology, there are two paths for sending information between the communication devices. A first path or channel is provided by a direct wire line connection. For example, the portable device is mated with a cradle coupled to a desktop computer which is connected by the Internet to a mail server. A second path or channel is provided by a wireless connection between the portable device and the mail server when the portable device is not connected to the cradle. Wireless communication is generally much slower and more expensive than wire line communication. Thus, a less expensive, high speed communication path is provided by the wire line connection and an alternative higher cost, lower speed communication path is provided by the wireless connection.

In the disclosed technology, the data to be transmitted from one device to another is analyzed and combined with historical data obtained from prior analysis to locate frequently repeated patterns. The repetitive patterns are stored in a dictionary which is transmitted from one communication device to the other communication device using the less expensive channel, when available. In one embodiment, the dictionary is always synchronized from one device to the other whenever the less expensive communication path is available and such a transfer is deemed necessary. In one embodiment, this synchronization of the portable device's dictionary with the mail server's dictionary is performed as often as deemed necessary and is not related to how often primary data transfer occurs. The method includes analyzing the quality of the portable device's dictionary, DICT 1, relative to the mail server's dictionary, DICT 2. The mail server is already aware of the portable device's dictionary, DICT 1, since it previously generated and transmitted that dictionary to the portable device. If the mail server determines that dictionary DICT1 is better quality than dictionary DICT 2, or that the difference between the two is not significant, then data to be transmitted to the portable device is compressed using dictionary DICT 1 and is then sent by the mail server to the portable device. If dictionary DICT 2 provides better compression and transmission is to take place over the less expensive channel, namely the wire line path, then the data is compressed using dictionary DICT 2. The data compressed using dictionary DICT 2 along with dictionary DICT 2 itself are then sent to the portable device over the less expensive channel. However, if it is found that dictionary DICT 2 provides better compression but the current connection path is expensive, for example wireless, then dictionary DICT 1 is used for compressing the data and dictionary DICT 2 is scheduled to be sent by the less expensive connection path, namely wire line, at a later time.

FIG. 1 is a block diagram of the disclosed communication system 100 which includes a message server or mail server 105. A general purpose computer including a processor 110 coupled to a system memory 115 and a non-volatile mass storage 120 such as a hard disk drive is conveniently employed as mail server 105. Mail server 105 includes a plurality of message boxes or mailboxes 201, 202 . . . N wherein N is the total number of mailboxes in the system. The system includes a plurality of portable communication devices or clients 301, 302, . . . M wherein M is the total number of portable communication devices in the system. In this particular embodiment, each communication device 301, 302, . . . M has a corresponding mailbox 201, 202 . . . in mail server 105. However, other embodiments are possible in which a portable communication device can have more than one mailbox in mail server 105. It is noted that in actual practice, mailboxes 201, 202 . . . N are located in storage 120 and/or memory 115.

Portable communication devices 301, 302 . . . are each capable of communicating over 2 different communication channels, namely a lower cost wire line path and a higher cost wireless path back to mail server 105. More particularly, each portable device 301, 302 . . . can transmit wirelessly via its antenna 135 to a communication facility 130 which is connected to mail server 105. Each of portable communication devices 301, 302 . . . has a unique ID code that is associated therewith. The ID code functions as the address of the portable communication device so that mail server 105 can send email messages and other information to particular portable communication devices. Portable communication devices 301, 302, . . . can each mate with a cradle or other port in a respective desktop computer 401, 402, . . . J wherein J is the total number of desktop computers.

A representative case is now discussed wherein mail server 105 desires to send an email message or other information to a particular portable device, for example, portable device 301. Email or other information intended for portable device 301 is received by mail server 105 at port 105A and is stored in memory 115 for later transmission to portable device 301. Each portable device 301, 302. . . M includes a compression dictionary, DICT 1, containing repeated patterns unique to the particular portable device. More particularly, portable devices 301, 302, . . . M include dictionaries DICT 1(301), DICT 1(302), . . . DICT 1(M), respectively. These dictionaries are stored in respective memories (not shown) within the portable devices. In the case of mail server 105 sending data intended for portable device 301, the server will update the portable device with the latest dictionary whenever the portable device is coupled to the mail server by the lower cost wire line connection through the personal computer with cradle. Synchronizing technologies such as Active Sync and Hot Sync can be used to achieve this end. (Active Sync is a trademark of Microsoft Corporation. Hot Sync is a trademark of 3COM.) Although the lower cost wire line channel is available in this case, mail server 105 will determine whether or not to update the DICT 1 dictionary in the portable device with the DICT 2 dictionary in the server as will be described in more detail later.

Mail server 105, which serves as a data source in this example, maintains two dictionaries for each portable device with which it needs to communicate. For example, with respect to portable device 301, mail server 105 stores compression dictionary, DICT 1(301) and compression dictionary DICT 2(301). The DICT 1(301) dictionary stored in mail server 105 is the same DICT 1(301) dictionary as stored in memory in portable device 301. The question to be decided is whether the new DICT 2 dictionary should be sent from mail server 105 to portable device 301 to replace the DICT 1 dictionary stored there earlier. The DICT 1 dictionary is a compression dictionary that is known to have been successfully synchronized with portable device 301. This DICT 1 dictionary is older than the DICT 2 dictionary. The DICT 2 dictionary is a compression dictionary that is currently determined by mail server 105 to provide more optimal compression after the server analyzes all data including the data that is yet to be sent to the portable device.

Each time that the data source, namely mail server 105, wants to communicate with a particular portable device 301, 302, . . . M, the server will analyze the quality of both the DICT 1 dictionary that was previously used for that portable device and the quality of a new DICT 2 dictionary. The DICT 2 dictionary is created by analyzing the data of the current message to find repetitive patterns. A compression step can be used to help determine the quality of the two dictionaries. In one embodiment, the DICT 2 dictionary is created by using a compression algorithm which analyzes the data of the current set of messages and previous N1 messages to find repetitive patterns. N1 is a number, for example 200, chosen to be large enough that the contents of one particular message do not unfairly influence the dictionary. Based on the size of the dictionary desired, namely N2 (configurable by system administrator), the algorithm will find longest and most repetitive N2 patterns of text in the last N1 messages. N2 will usually be a power of 256 so that the index to the dictionary will be 1 byte, 2 bytes, and so forth. Theoretically N2 can be any value, but it was found to be more efficient if N2 is at least a power of 2, 16, or 256. The algorithm is tailored toward finding a set of sufficiently repetitive patterns which are long enough to make the compression efficient. Many such algorithms, for example Hoffman Encoding and Deflate, already exist for this purpose. Any such compression algorithm which results in a dictionary of patterns that compresses data may be used.

The DICT 1 dictionary was made from a similar list of N1 messages, those messages being older than the current set of messages. The disclosed system will compress the current set of messages with dictionary DICT 1 and then with new dictionary DICT 2 and see what savings can be achieved by using DICT 2 as compared with DICT1. If the savings achieved are N3 times or more (wherein N3 is a number selected by the system administrator) higher than the cost involved in transmitting the new dictionary to the other side, the new dictionary is scheduled to be transmitted to the target portable communications device. As described previously in one embodiment, the system will actually use DICT 2 only if the target portable communications device is connected over a less expensive channel, for example a wire line channel. Otherwise dictionary DICT 2 is scheduled to be transmitted later.

In most cases, although the system creates a new dictionary DICT 2, the space savings on a few messages won't justify transmitting the new dictionary DICT 2 to the other side, namely to the target communication device 301, 302, . . . M. In this case, the system records the savings that it could have had as S1, and adds to this numerical value every time it detects a savings that could have been achieved by using dictionary DICT2. Some time in the future, this savings value S1 will exceed the cost of transmitting DICT 2 by a factor of N3 as described above. When this occurs, the system will schedule the new dictionary DICT 2 to be sent to the target portable communications device and will complete that communication when the target device is coupled to server 105 by a low cost communication channel. In another embodiment, the mere fact that the new DICT 2 dictionary is based on the new data from the current message is enough to ascertain its quality as being better than the previous DICT 1 dictionary stored in the respective portable device.

The overall operation of mail server 100 is carried out under the guidance of control software 140. In actual practice, control software is permanently stored in storage 120 and in memory 115 while being executed. Mailboxes 201, 202, . . . N and dictionaries DICT 1 and DICT 2 are also stored in storage 120 and memory 120.

Figure 2:
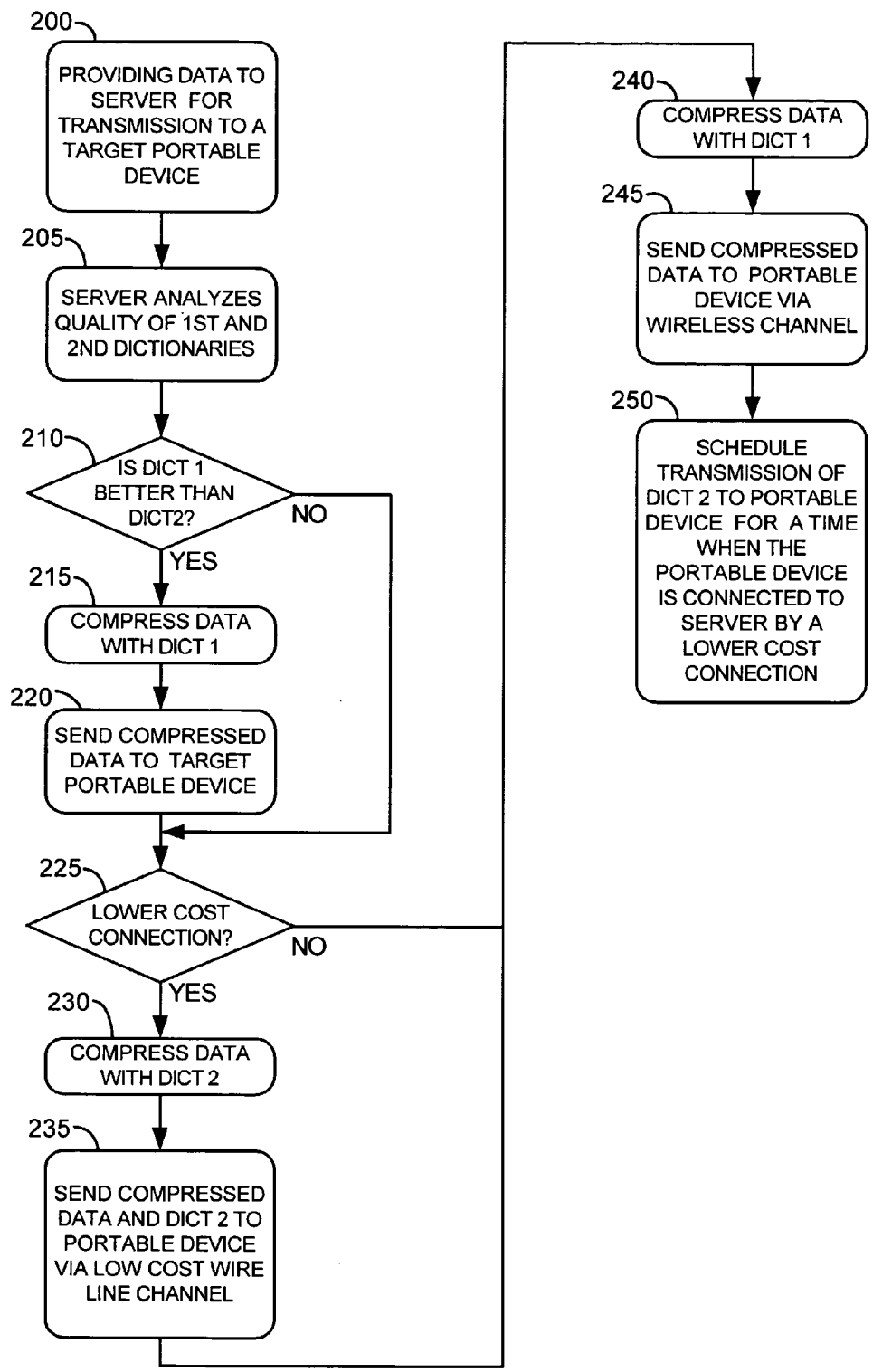
FIG. 2 is a flow chart depicting process flow in the disclosed communication system.

FIG. 2 is a flow chart which shows process flow in the disclosed system and method. The overall operation of mail server 100 is carried out under the guidance of control software 140. In actual practice, control software is permanently stored in storage 120 and in memory 115 while being executed. Data such as email or other message content are provided to mail server 105 for transmission to a target portable device, for example portable device 301, as per block 200. A target portable device is the particular portable device to which a message is addressed. The mail server analyzes the quality of the DICT 1 dictionary already stored in the target portable device and the quality of the new DICT 2 dictionary as per block 205. Compression dictionary DICT 1 is an older dictionary created of repetitive patterns from earlier email messages addresses to a particular portable device. Compression dictionary DICT2 is a more recent dictionary than DICT 1. Dictionary DICT2 includes repetitive patterns from the current email message or other recent messages in one embodiment of the system. Although the DICT 1 dictionary is stored in the target portable device, mail server 105 also retains a copy of DICT 1 in storage for use in compressing data. When the server receives a new current message that is addressed to a particular portable device, an assessment is made by the server to determine if the quality of the DICT 1 dictionary is better than the quality of the DICT 2 dictionary as per decision block 210. If the quality of DICT 1 is better than the quality of DICT 2 for the target portable device, then the data to be communicated is compressed using the older DICT 1 dictionary as per block 215. The compressed data is then sent to the target portable device as per block 220.

If a decision was made at decision block 210 that DICT 1 is not better quality than DICT 2, then process flow continues to decision block 225 at which a determination is made as to whether or not a lower cost connection is currently available. If a lower cost connection, for example a high speed wire line channel, is available then the data to be transmitted to the target portable device is compressed using the new DICT 2 dictionary as per block 230. The compressed data and the DICT 2 dictionary are then sent over the wire line connection to the target portable device as per block 235. However, if at decision block 225 a determination was made that a lower cost connection is not available, then process flow continues to block 240 at which the data to be transmitted to the target portable device is compressed using DICT 1. The resultant compressed data is then sent to the target portable device by the more expensive wireless channel as per block 245. Even though DICT 2 is better than DICT 1 in this example, DICT 2 is not sent to the target portable device at this time. Rather, as per block 250, server 105 schedules a later transmission of DICT 2 to the target portable device at a time when the target portable device is connected to the server via a less expensive channel as opposed to the currently connected more expensive wireless channel. It is noted that the initial transmission of data to the target device does not benefit from compression until the dictionary is transmitted to the target device for use in decompressing subsequent messages. The benefits of the disclosed technology are felt after the first transmission of the dictionary via the less expensive channel.

In one embodiment such as the disclosed system for transferring email, the system analyzes all email messages previously received by a particular target portable device. Patterns found in newer messages, for example messages in the last month or last week, are given higher priority. By analyzing a sufficient amount of data, the system builds a dictionary of patterns which are arranged in decreasing order of frequency of use. For example, if a user of the target portable device receives numerous email messages daily from "John.Smith@sample.com", there is a high probability that this pattern will be included in the new compression dictionary. Once the pattern is placed in the dictionary, the entire sequence "John.Smith@sample.com" would be represented by one or two bytes depending on the size of the dictionary. One byte enables a dictionary size of 256 patterns. Two bytes enables a dictionary size of 65535 patterns. In a particular application, the size of the dictionary is determined by the storage capacity in the portable device and the server among other factors. Processing time and accuracy of the dictionary are other factors that affect dictionary size. Although larger dictionaries provide improved compression, there is a higher chance of missing hits. The server stores large amounts of historical data from prior messages sent to each target portable device that can help the server create higher quality dictionaries that are better suited for each target portable device. By maintaining multiple dictionaries per target portable device, the server is able to find an optimal dictionary for future transactions.

Advantageously, the disclosed method and system provide more optimal dictionaries to target portable devices. Data exchanged between two devices is compressed and sent over multiple network paths, not necessarily at the same time. Overall cost is reduced by transmitting a dictionary of frequently used patterns via a less expensive channel. The system transmits compressed data via less expensive wire line or by more expensive wireless. However, in one embodiment, the system waits to send dictionary updates until the target portable device is connected to the server device via a less expensive channel such as wire line.

Although in the system and method disclosed above two communication channels were used, a system using a greater number of channels can also be used. More particularly, a system communicating over more than two channels can use the same techniques as discussed above where the system weighs the cost of transmitting a new dictionary against the possible savings achieved from using the new dictionary.

While two dictionaries were employed in the sample system discussed above, depending on the processing power of the mail server system, it is possible to use more than two dictionaries. More particularly, the system can maintain a history of dictionaries DICT2, DICT3, DICT4, etc. and then perform exhaustive comparisons with all the available dictionaries to choose the best.

Although illustrative embodiments have been shown and described, a wide range of modification, change and substitution is contemplated in the foregoing disclosure. For example, the messages processed by the disclosed system can be text mail or voice mail messages. Some features of an embodiment may be employed without a corresponding use of other features. Accordingly, it is appropriate that the appended claims be construed broadly and in manner consistent with the scope of the embodiments disclosed herein.

What is claimed is:

1. A method of communicating data stored on a first communication device to a second communication device comprising:

receiving data by the first communication device;

generating, by the first communication device, first and second dictionaries from the received data, the first dictionary being based on data received earlier than data used to generate the second dictionary, the first dictionary being provided to the second communication device;

sending the second dictionary to the second communication device if the second communication device is presently connected to the first communication device by a first channel there between exhibiting a cost of operation less than the cost of operation of a second channel there between; and scheduling transmission of the second dictionary to the second communication device at a later time when the second communication device is connected to the first communication device by the first channel if the second communication device is not presently connected to the first communication device by the first channel.

2. The method of claim 1 wherein the first channel is a wire line channel.

3. The method of claim 1 wherein the second channel is a wireless channel.

4. The method of claim 1 including compressing the data with the second dictionary to generate compressed data which is sent together with the second dictionary to the second communication device when the second communication device is connected to the first communication device by the first channel.

5. The method of claim 1 including compressing the data with the first dictionary to generate compressed data which is sent to the second communication device if the second communication device is presently connected to the first communication device by the second channel.

6. A method of communicating data stored on a first communication device to a second communication device comprising:

receiving data by the first communication device;

generating, by the first communication device, first and second dictionaries from the received data, the first dictionary being based on data received earlier than data used to generate the second dictionary, the first dictionary being provided to the second communication device; and sending the second dictionary to the second communication device if the second communication device is presently connected to the first communication device by a first channel there between exhibiting a cost of operation less than the cost of operation of a second channel there between;

determining if the quality of the first dictionary is better than the quality of second dictionary; and compressing the data with the first dictionary to generate compressed data which is sent to the second communication device if the quality of the first dictionary is greater than the quality of the second dictionary and the second communication device is connected to the first communication device by the second channel.

7. The method of claim 6 wherein the first communication device is a server.

8. The method of claim 6 wherein the second communication devices is a client.

9. The method of claim 8 wherein the client is a portable communication device.

10. The method of claim 8 including maintaining first and second dictionaries for each of a plurality of second communication devices.

11. A communication system comprising:

a first communication device for receiving data; and a second communication device connectable to the first communication device by a first channel or a second channel there between, the first channel exhibiting a cost of operation less than the cost of operation of the second channel;

the first communication device including first and second dictionaries which are generated in the first communication device, the first dictionary being based on data received earlier than data used to generate the second dictionary, the first dictionary being provided to the second communication device, the first communication device sending the second dictionary to the second communication device if the second communication device is presently connected to the first communication device by a first channel there between exhibiting a cost of operation less than the cost of operation of the second channel there between, wherein the first communication device schedules transmission of the second dictionary to the second communication device at a later time when the second communication device is connected to the first communication device by the first channel if the second communication device is not presently connected to the first communication device by the first channel.

12. The communication system of claim 11 wherein the first channel is a wire line channel.

13. The communication system of claim 11 wherein the second channel is a wireless channel.

14. The communication system of claim 11 wherein the first communication device compresses the data with the second dictionary to generate compressed data which is sent together with the second dictionary to the second communication device when the second communication device is connected to the first communication device by the first channel.

15. The communication system of claim 11 wherein the first communication device compresses the data with the first dictionary to generate compressed data which is sent to the second communication device if the second communication device is presently connected to the first communication device by the second channel.

16. The communication system of claim 11 wherein the first communication system compresses the data with the first dictionary to generate compressed data which is sent to the second communication device if the quality of the first dictionary is greater than the quality of the second dictionary and the second communication device is connected to the first communication device by the second channel.

17. The communication system of claim 11 wherein the first communication device is a server.

18. The communication system of claim 11 wherein the second communication devices is a client.

19. The communication system of claim 18 wherein the client is a portable communication device.

* * * * *